United States Patent
Manushi et al.

(10) Patent No.: US 10,251,297 B2
(45) Date of Patent: Apr. 2, 2019

(54) PRINTED CIRCUIT BOARD HOUSING INCLUDING GUIDING RIBS

(71) Applicants: Robert Bosch LLC, Broadview, IL (US); Robert Bosch GmbH, Stuttgart (DE)

(72) Inventors: Ligor Manushi, Northville, MI (US); Keith Gerber, West Bloomfield, MI (US); Alexander Moore, Ann Arbor, MI (US)

(73) Assignees: Robert Bosch LLC, Broadview, IL (US); Robert Bosch GmbH, Stuttgart (DE)

( * ) Notice: Subject to any disclaimer, the term of this patent is extended or adjusted under 35 U.S.C. 154(b) by 30 days.

(21) Appl. No.: 15/386,455

(22) Filed: Dec. 21, 2016

(65) Prior Publication Data
US 2018/0177067 A1 Jun. 21, 2018

(51) Int. Cl.
H05K 1/18 (2006.01)
H05K 5/00 (2006.01)
H05K 5/03 (2006.01)
H05K 7/14 (2006.01)

(52) U.S. Cl.
CPC .......... *H05K 7/1418* (2013.01); *H05K 1/181* (2013.01); *H05K 5/0047* (2013.01); *H05K 5/03* (2013.01); *H05K 7/1427* (2013.01)

(58) Field of Classification Search
None
See application file for complete search history.

(56) References Cited

U.S. PATENT DOCUMENTS

| 3,666,134 | A | * | 5/1972 | Rauch | E05B 65/006 174/50 |
| 4,811,165 | A | * | 3/1989 | Currier | H05K 1/189 361/716 |
| 5,473,509 | A | * | 12/1995 | Schoettl | B60R 16/0239 361/715 |
| 5,703,754 | A | * | 12/1997 | Hinze | B60R 16/0239 174/562 |

(Continued)

FOREIGN PATENT DOCUMENTS

| DE | 20208019 | 1/2003 |
| DE | 102012206980 | 10/2013 |
| JP | 2002118369 | 4/2002 |

*Primary Examiner* — Dimary S Lopez Cruz
*Assistant Examiner* — Muhammed Azam
(74) *Attorney, Agent, or Firm* — Kelly McGlashen; Maginot Moore & Beck LLP

(57) ABSTRACT

A cover of a housing for an electronic control unit (ECU) includes a planar end portion, sidewall portions that surround a periphery of the end portion, and guide ribs that protrude inward from a base-facing surface of the end portion. Each rib includes a free edge that is spaced apart from the base-facing surface of the end portion and extends between the rib first end and the rib second end. The free edge height varies between the rib first and second ends such that the free edge follows a curvilinear path between the rib first and second ends. The free edge is configured so that, during insertion of a printed circuit board (PCB) of the ECU into the housing, the angular orientation of the PCB relative to housing changes as the PCB slides along the free edge whereby interference between the PCB and the housing during insertion is avoided.

20 Claims, 12 Drawing Sheets

(56) References Cited

U.S. PATENT DOCUMENTS

| | | | |
|---|---|---|---|
| 5,777,854 A * | 7/1998 | Welch | H05K 9/0016 174/351 |
| 5,936,842 A * | 8/1999 | Kaiser | E05F 15/668 160/188 |
| 6,042,392 A * | 3/2000 | Tsuji | H01R 13/62977 361/752 |
| 6,276,950 B1 | 8/2001 | Yodogawa | |
| 6,552,911 B1 * | 4/2003 | Haupt | B23K 26/28 174/50 |
| 6,628,523 B2 * | 9/2003 | Kobayashi | H05K 5/0047 361/736 |
| 6,717,051 B2 * | 4/2004 | Kobayashi | B60R 16/0239 174/535 |
| 7,616,448 B2 * | 11/2009 | Degenkolb | H05K 3/284 174/50.5 |
| 7,667,973 B2 * | 2/2010 | Shinoda | H05K 5/0047 174/50 |
| 7,857,637 B2 * | 12/2010 | Kasai | H05K 3/306 439/76.2 |
| 8,023,273 B2 * | 9/2011 | Chlumsky | H05K 5/006 174/50.52 |
| 8,139,364 B2 * | 3/2012 | Wickett | H05K 5/061 174/50 |
| 8,727,794 B2 * | 5/2014 | Tanaka | H05K 5/064 361/752 |
| 9,093,776 B2 * | 7/2015 | Yamanaka | H05K 5/0069 |
| 10,010,006 B2 * | 6/2018 | Tanaka | H05K 5/0069 |
| 2002/0024800 A1 * | 2/2002 | Skofljanec | H05K 5/006 361/752 |
| 2005/0105253 A1 * | 5/2005 | Sakai | H05K 5/0039 361/752 |
| 2007/0076383 A1 * | 4/2007 | Sasaki | H05K 5/063 361/752 |
| 2008/0291646 A1 * | 11/2008 | Fino | H05K 7/20445 361/752 |
| 2013/0070432 A1 * | 3/2013 | Kawai | H05K 5/0052 361/752 |
| 2016/0066458 A1 * | 3/2016 | Hirose | H05K 5/006 361/752 |
| 2017/0265318 A1 * | 9/2017 | Taubert | H05K 5/0073 |
| 2018/0177067 A1 * | 6/2018 | Manushi | H05K 1/181 |

* cited by examiner

PRINTED CIRCUIT BOARD HOUSING INCLUDING GUIDING RIBS

BACKGROUND

Electronic devices such as an electronic control unit (ECU) may include a housing and a printed circuit board (PCB) that is enclosed in the housing. The housing protects the PCB from the environment and may facilitate mounting of the PCB within the larger structure of the electronic device. The PCB may include embedded circuitry and may support electronic components on one or both surfaces of the PCB. The PCB may further include a header which houses an electrical connector. The header is mounted to the PCB and the electrical connector is electrically connected to the embedded circuitry. A portion of the header protrudes through an opening in the housing to allow the PCB to be electrically connected to an external circuit or device. During manufacture of the electronic device, it can be challenging to ensure that the PCB is inserted into the housing in the proper orientation. Moreover, it can be challenging to insert the PCB into the housing while placing the header in the housing opening and while also avoiding a collision of the electronics on a surface of the PCB with the housing.

SUMMARY

In some aspects, an electronic control unit includes PCB disposed in a housing. The housing includes a base, and a cover that overlies the base. The cover includes a planar end portion, sidewall portions that surround a periphery of the end portion, and a rib that protrudes inward from a base-facing surface of the end portion. The rib has a first end adjacent a first one of the sidewall portions, a second end adjacent a third one of the sidewall portions, and a free edge that is spaced apart from the base-facing surface of the end portion. The free edge extends between the rib first end and the rib second end. The PCB has a cover-facing surface, a base-facing surface, and electrical components supported on at least one of the cover-facing surface and the base-facing surface. A height of the free edge is a distance between the free edge and the base-facing surface of the end portion in a direction normal to the base-facing surface of the end portion, and the height of the free edge varies between the rib first end and the rib second end such that the height of the free edge is greatest at a location between the rib first end and the rib second end.

The electronic control unit may include one or more of the following features: The free edge defines a curvilinear path between the first end and the second end. The rib defines a plane that passes through the rib first end, the rib second end and the free edge, and the plane is perpendicular to the third one of the sidewall portions. The rib includes a first convex portion corresponding to the location of greatest height, a second convex portion at a location between the first convex portion and the rib second end, a first ramp portion between the rib first end and the first convex portion, a second ramp portion at a location between the first convex portion and the second convex portion, and a flat portion that is parallel to the end portion inner surface. The flat portion is disposed between the second convex portion and the rib second end. A first end of the rib is integral with the first one of the sidewall portions, and a gap exists between the rib second end and the third one of the sidewall portions. The cover is configured so that the printed circuit board is supported on the rib during assembly of the printed circuit board with the housing, and when the printed circuit board is fully assembled with the housing, a space exists between the rib and the printed circuit board.

In some aspects, a housing for an electronic control unit includes a base, and a cover that overlies the base. The cover has a planar end portion, sidewall portions that surround a periphery of the end portion, and a rib that protrudes inward from a base-facing surface of the end portion. The rib includes a first end adjacent a first one of the sidewall portions, a second end adjacent a third one of the sidewall portions, and a free edge that is spaced apart from the base-facing surface of the end portion. The free edge extends between the rib first end and the rib second end. A height of the free-edge is a distance between the free edge and the base-facing surface of the end portion in a direction normal to the base-facing surface of the end portion, and the free edge height varies between the rib first end and the rib second end such that the free edge height is greatest at a location between the rib first end and the rib second end.

The housing may include one or more of the following features: The free edge defines a curvilinear path between the first end and the second end. The rib defines a plane that passes through the rib first end, the rib second end and the free edge, and the plane is perpendicular to the third one of the sidewall portions. The rib includes a first convex portion corresponding to the location of greatest height, a second convex portion at a location between the first convex portion and the rib second end, a first ramp portion between the rib first end and the first convex portion, a second ramp portion at a location between the first convex portion and the second convex portion, and a flat portion that is parallel to the end portion inner surface, the flat portion disposed between the second convex portion and the rib second end. A first end of the rib is integral with the first one of the sidewall portions, and a gap exists between the rib second end and the third one of the sidewall portions. The cover is configured so that the printed circuit board is supported on the rib during assembly of the printed circuit board with the housing, and when the printed circuit board is fully assembled with the housing, a space exists between the rib and the printed circuit board.

In some aspects, a method of assembling a PCB within a housing is provided. In the method, the housing includes a base and a cover that overlies and can be secured to the base. The method may include: Providing the housing cover. The cover includes a planar end portion, a first sidewall portion, a second sidewall portion, a third sidewall portion and a fourth sidewall portion. The first, second, third and fourth sidewall portions surround a periphery of the end portion and protrude in a direction normal to a base-facing surface of the end portion. The third sidewall portion has an opening. The third sidewall portion is opposed to the first sidewall portion, and free ends of the first, second, third and fourth sidewall portion define a cover open end. The cover includes a rib that protrudes inward from the base-facing surface of the end portion.

The method may include: Providing the PCB. The PCB includes a cover-facing surface, a base-facing surface, and electrical components supported on at least the printed circuit board cover-facing surface. The PCB includes a header supported on the printed circuit board cover-facing surface. The header is disposed at a first end of PCB so as to protrude outward from the printed circuit board first end in a direction parallel to the printed circuit board cover-facing surface. The header includes a flange. The flange resides in a plane that is transverse to the printed circuit board cover facing surface. The flange includes a first edge parallel to and facing away from the printed circuit board cover-facing surface.

The method may include: Orienting the printed circuit board such that the printed circuit board cover-facing surface faces toward the cover and the header serves as a leading edge.

The method may include: Inserting the printed circuit board into the cover open end such that the flange first edge abuts a free edge of the rib.

The method may include: Sliding the flange first edge along the rib free edge in a direction toward the third sidewall portion. The rib free edge is configured to change the angular orientation of the printed circuit board relative to housing as the flange first edge slides along the rib free edge.

The method may include the following step or feature: For a given position of the flange first edge along the rib free edge, an angle of the printed circuit board relative to the base-facing surface of the end portion corresponds to the angle of the rib free edge relative to the base-facing surface of the end portion.

The method may include the following step or feature: The rib free edge is configured so that the angular orientation of the printed circuit board relative to housing changes as the printed circuit board slides along the free edge.

The method may include the following step or feature: During the step of sliding, the printed circuit board is supported on the rib, and subsequent to the step of sliding and when the printed circuit board is assembled within the housing, a space exists between the rib and the printed circuit board.

The method may include the following step or feature: The header includes a mount portion disposed on one side of the flange. The mount portion overlies the printed circuit board first end, and a shroud portion disposed on another side of the flange. The shroud portion protrudes outward from the printed circuit board first end in a direction parallel to the printed circuit board cover-facing surface. In addition, the third one of the sidewall portions has an opening, and the step of sliding the flange first edge along the rib free edge in a direction toward the third sidewall portion includes passing the shroud portion through the opening.

The method may include the following step or feature: The rib free edge is configured so that the angular orientation of the printed circuit board relative to housing changes as the printed circuit board slides along the free edge of the rib.

The method may include the following step or feature: The rib free edge is configured to orient the printed circuit board relative to the cover in such a way that the electrical components remain spaced apart from the cover first sidewall portion during sliding.

The method may include the following step or feature: A gap exists between the rib second end and the third sidewall portion, and following the step of sliding the flange first edge along the rib free edge, the flange first edge moves into the gap, and the shroud portion protrudes through the opening.

In some aspects, an electronic device includes an ECU having a housing and a PCB disposed in the housing. The housing is formed having guiding ribs that are configured to facilitate assembly of the PCB within the housing during manufacture. In particular, during insertion of the PCB into the housing, the ribs guide the PCB into the housing along a predetermined path and in an orientation that avoids any possible collision of the PCB, the header and/or electronic components mounted on the PCB, with the housing. This is accomplished, at least in part, since the ribs are configured so that the angular orientation of the PCB relative to housing changes as the PCB is guided along the predetermined path.

DETAILED DESCRIPTION

Figure 1:
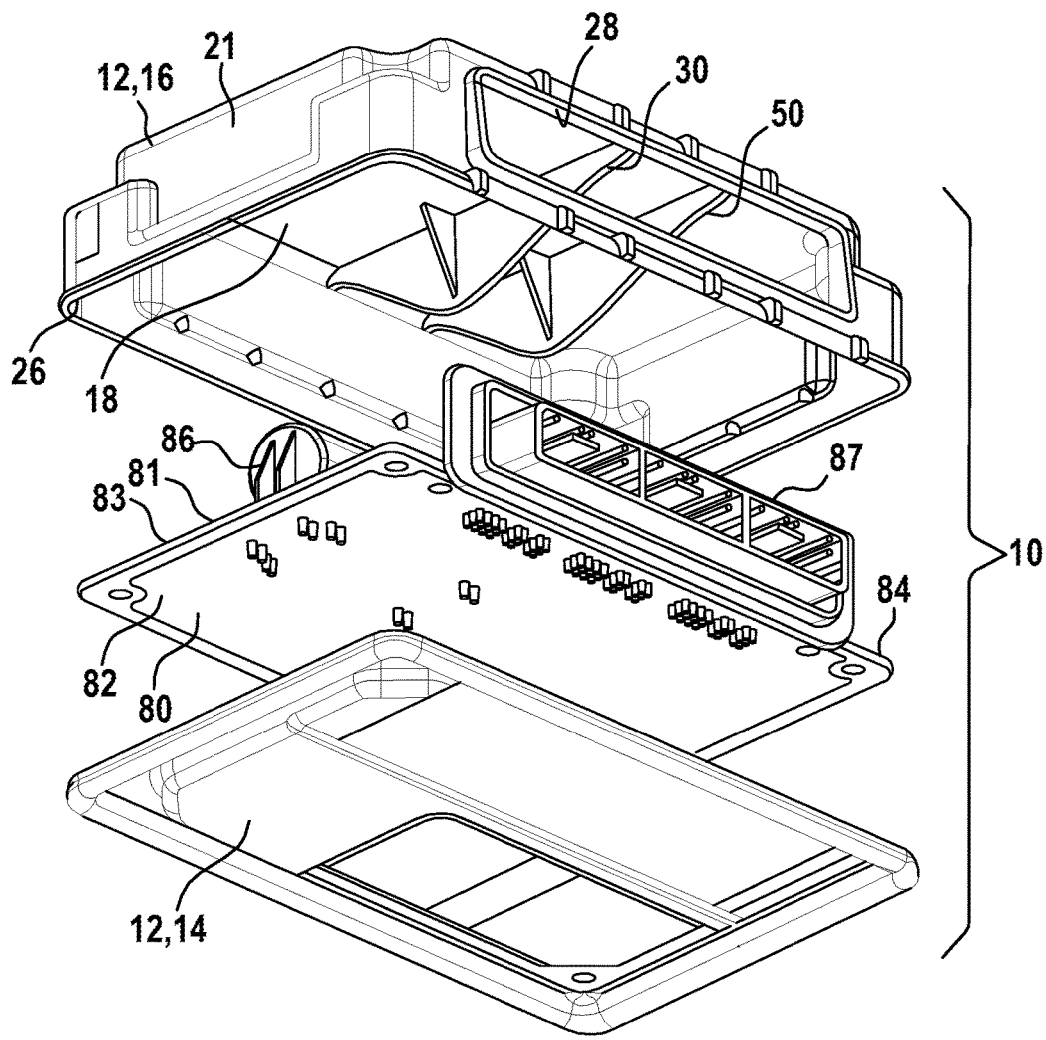
FIG. 1 is an exploded perspective view of an electronic device including a housing and a PCB disposed in the housing.
Figure 2:
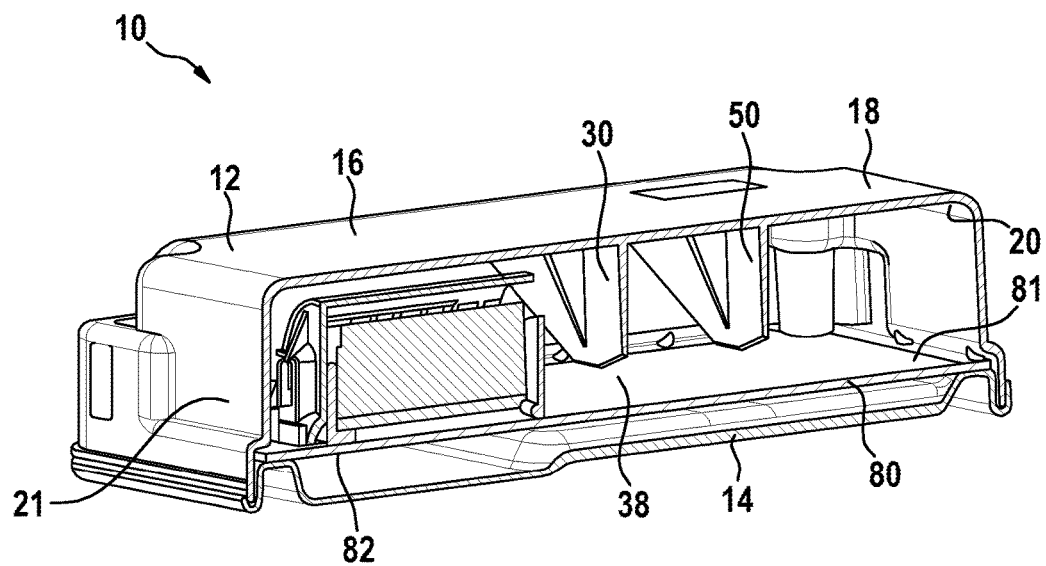
FIG. 2 is a cross-sectional view of the electronic device of FIG. 1 as seen along line 2-2 of FIG. 4.
Figure 3:
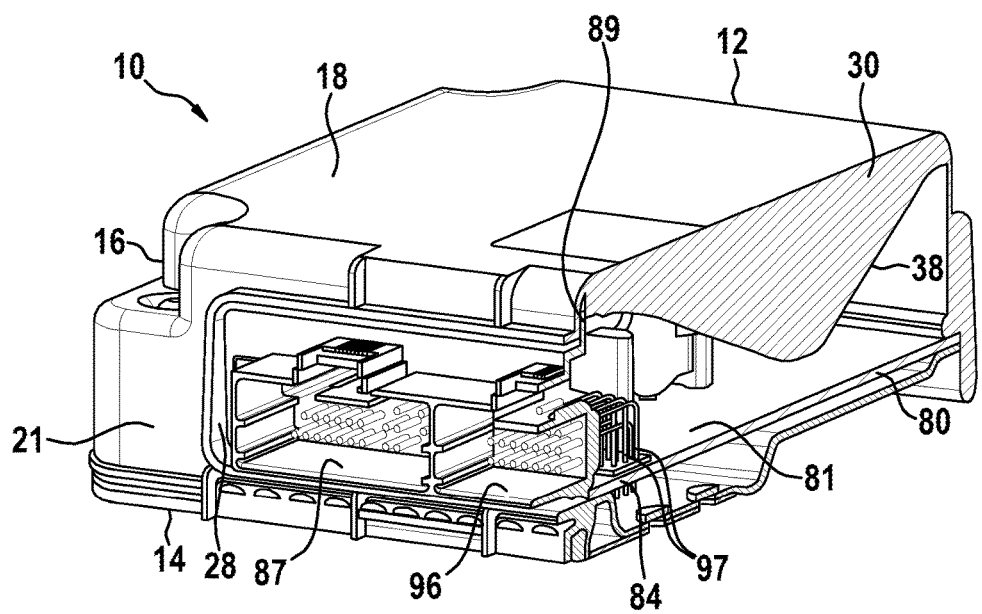
FIG. 3 is a cross-sectional view of the electronic device of FIG. 1 as seen along line 3-3 of FIG. 4.

Referring to FIGS. 1-3, an electronic device, for example an ECU 10, includes a housing 12 and a PCB 80 that is supported by, and enclosed within, the housing 12. The housing 12 includes a base 14 and a cover 16. The cover 16 includes a planar end portion 18 and a sidewall 21 that surrounds the end portion 18. The end portion 18 and the sidewall 21 together form an open-ended container, and the free end of the sidewall 21 defines the cover open end 26. The base 14 is shaped and dimensioned to close the cover open end 26. The cover 16 includes guiding ribs 30, 50 that are configured to facilitate assembly of the PCB 80 within the housing 12 during manufacture in the desired orientation and without interference between elements of the PCB 80 and the housing 12, as discussed further below.

The PCB 80 is a plate formed of a rigid, insulating substrate such as a glass epoxy. The PCB 80 includes a cover-facing surface 81, a base-facing surface 82, and a peripheral edge 83 that joins the cover-facing surface 81 to the base-facing surface 82. The PCB 80 mechanically supports and electrically connects electronic components 86 using electrically conductive tracks, pads and other features etched from electrically conductive sheets laminated with the substrate. The electrical components 86 are supported one or both of the PCB cover-facing surface 81 and the PCB base-facing surface 82. The PCB 80 may further include a header 87 that houses electrical conductors (e.g., bent pins 97) that are electrically connected to conductors of the PCB 80.

Figure 9:
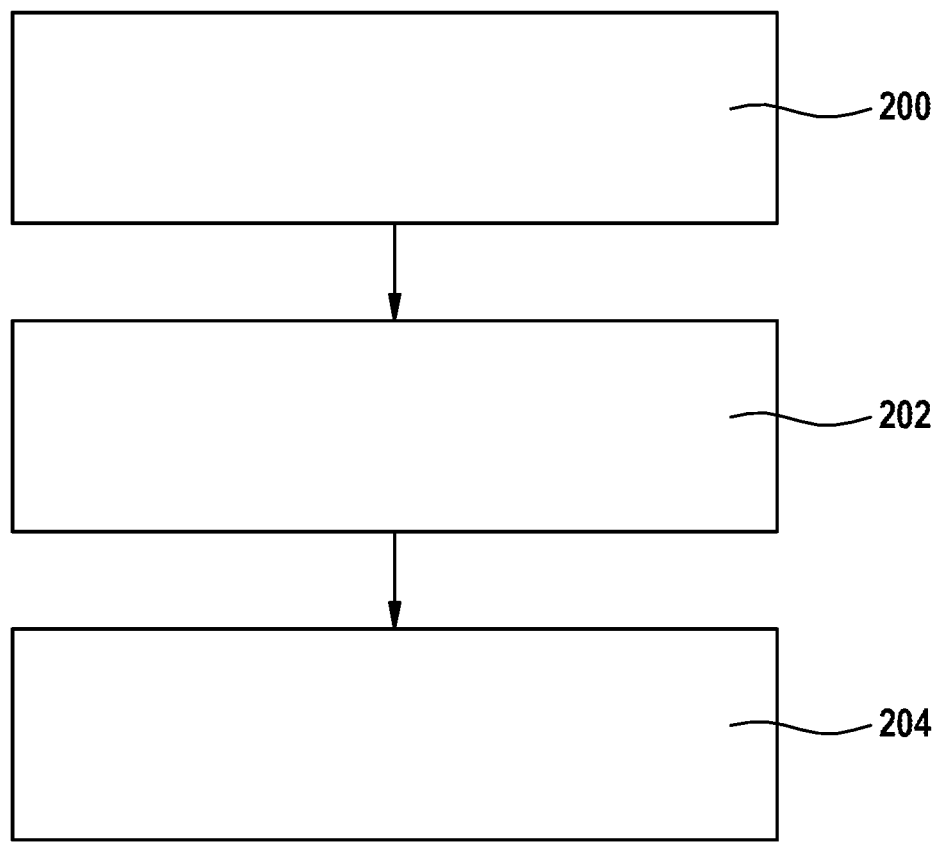
FIG. 9 is a flow chart of a method of assembly of the PCB with the housing.

Referring to FIGS. 3 and 9, the header 87 is supported on the PCB cover-facing surface 81. More specifically, the header 87 is disposed at a first end 84 of the PCB 80 and includes a mount portion 88 that overlies, and is secured to, the PCB first end 84, and a tubular shroud portion 96 that protrudes outward from the PCB first end 84 in a direction parallel to the PCB cover-facing surface 81. In addition, the header 87 includes a flange 89 disposed between the mount portion 88 and the shroud portion 96. The flange 89 is an outward protrusion that extends about a circumference of the header 87, and thus the flange 89 resides in a first plane P1 that is transverse to the PCB cover facing surface 81. A peripheral edge 90 of the flange 89 includes a first edge portion 91 that is parallel to, and faces away from, the PCB cover-facing surface 81. The flange first edge portion 91 engages the guiding ribs 30, 50 during insertion of the PCB 80 in the housing 12, as discussed further below. When the ECU 10 is fully assembled, the shroud portion 96 of the header 87 protrudes through an opening 28 in the housing cover 16 to allow the PCB to be electrically connected to an external circuit or device.

Figure 4:
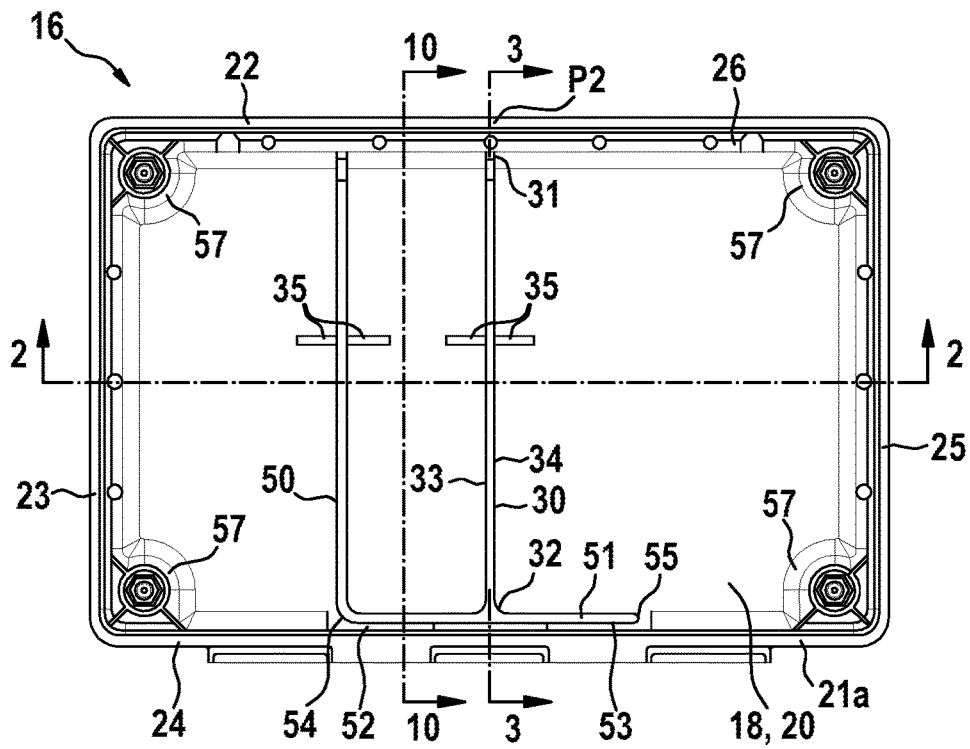
FIG. 4 is a bottom plan view of the housing cover.
Figure 5:
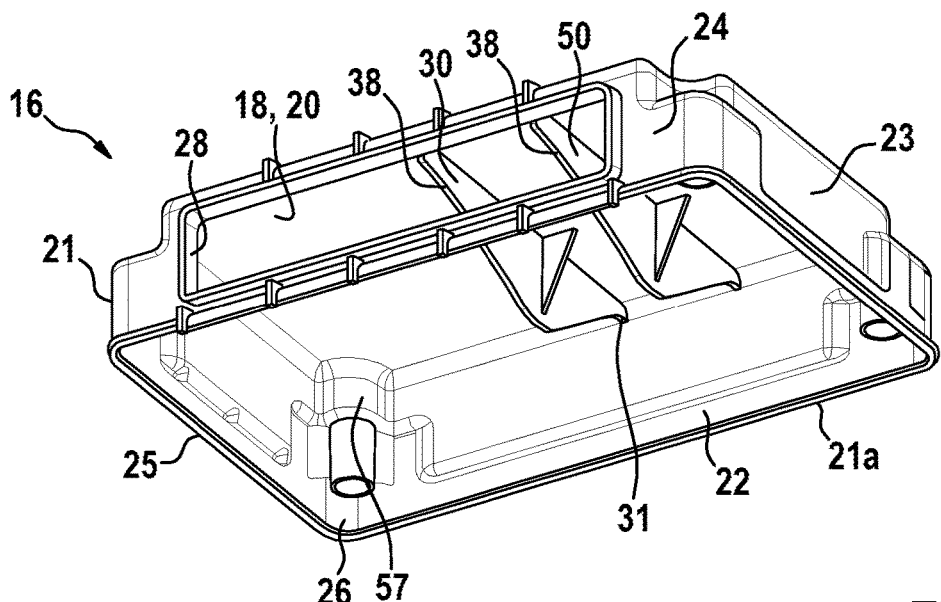
FIG. 5 is a bottom perspective view of the housing cover.

Referring to FIGS. 3-5, in the illustrated embodiment, the housing 12 has the shape of a rectangular prism, and the base 14 and the end portion 18 of the cover 16 are generally in the form of a rectangle. Thus the cover sidewall 21 includes a first sidewall portion 22, a second sidewall portion 23, a third sidewall portion 24 that is opposed to the first sidewall portion 22, and a fourth sidewall portion 25 that is opposed to the second sidewall portion 23. The second and fourth sidewall portions 23, 25 join opposed ends of the first and third sidewall portions 22, 24. The first, second, third and fourth sidewall portions 22, 23, 24, 25 surround a periphery of the end portion 18 and protrude in a direction normal to a base-facing surface 20 of the end portion 18. In addition, the third sidewall portion 24 includes the opening 28. The opening 28 is sized and shaped to receive the shroud portion 96 therethrough in a clearance fit. In the illustrated embodiment, the opening 28 is elongated and defines an area that is more than 70 percent of the area of the third sidewall portion 24.

Figure 6:
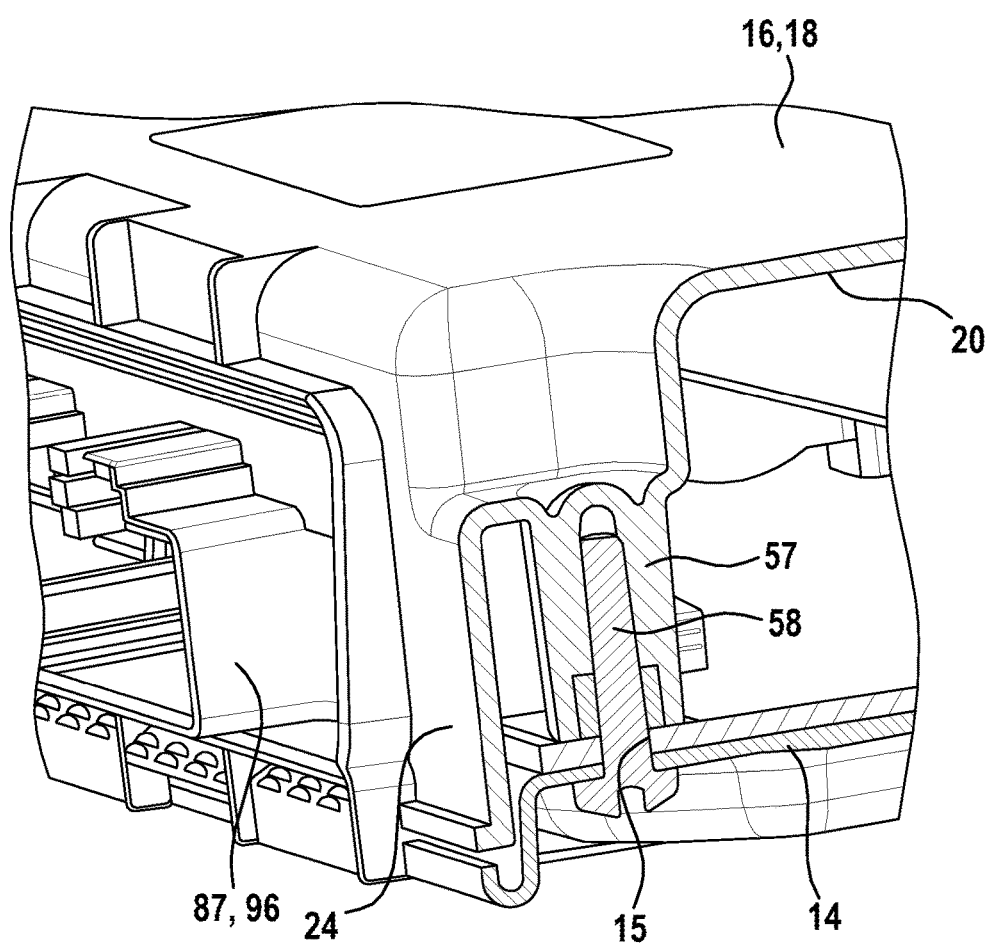
FIG. 6 is a cross-sectional view of a portion of the electronic device of FIG. 1.

Referring to FIGS. 4-6, the cover 16 is low-profile in that the height of the sidewall 21 is small relative to a length and width of the cover end portion 18, where the sidewall height corresponds to the distance from the end portion base-facing surface 20 to the sidewall free end 21*a*. In each corner of the cover end portion 18, a boss 57 protrudes from the end portion base-facing surface 20. Each boss includes a threaded opening shaped and dimensioned to receive a fastener 58. The fasteners 58 pass through corresponding openings 15 provided in each corner of the base 14, and are used to secure the cover 16 to the base 14.

The cover 16 includes the first rib 30 and the second rib 50. The ribs 30, 50 protrude inward toward the base 14 from the end portion base-facing surface 20. The ribs 30, 50 are parallel and spaced apart from each other. In addition, the ribs 30, 50 are each spaced apart from the second and fourth sidewall portions 23, 25. The first rib 30 is midway between the second and fourth sidewall portions 23, 25, and the second rib 50 is disposed between the first rib 30 and the second sidewall portion 23. In addition, the space between the first rib 30 and the fourth sidewall portion 25 is free of ribs. Each rib 30, 50 is identical, so only the first rib 30 will be described in detail.

Figure 7:
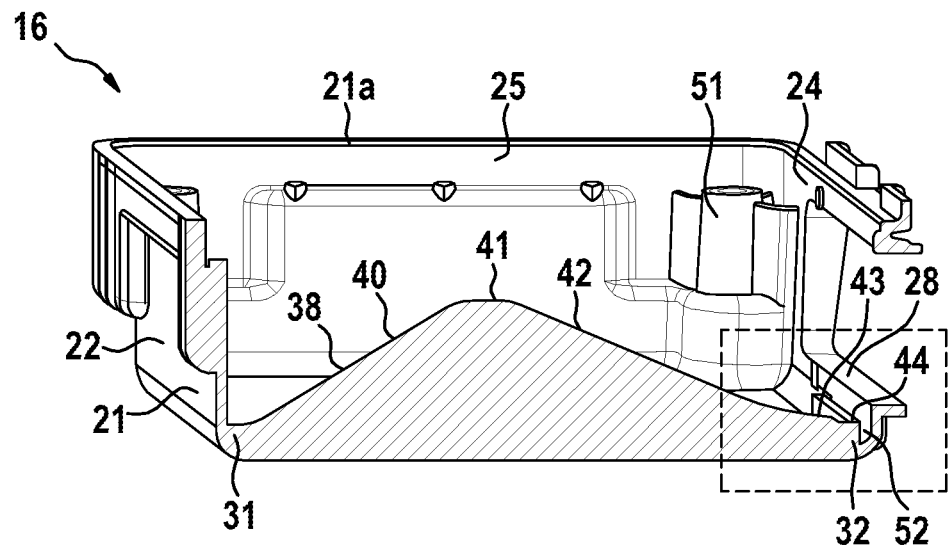
FIG. 7 is a cross-sectional view of the housing cover as seen along line 3-3 of FIG. 4.
Figure 8:
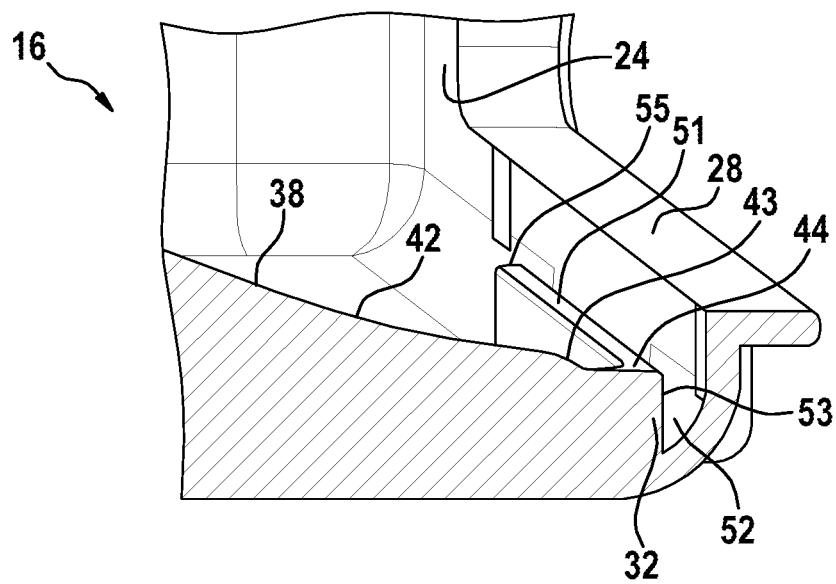
FIG. 8 is an enlarged view of the portion of FIG. 7 outlined in dashed lines.

Referring also to FIGS. 7 and 8, the rib 30 includes a first end 31 adjacent the first sidewall portion 22 and a second end 32 adjacent the third sidewall portion 24. Thus, the rib 30 extends in a direction that is perpendicular to the third sidewall portion 24 having the opening 28. The rib first end 31 intersects, and is formed integrally with, the first sidewall portion 22. The rib second end 32 is spaced apart from the third sidewall portion 24 such that a gap 52 exists between the rib second end 32 and the third sidewall portion 24.

The rib 30 includes a free edge 38 that is spaced apart from the end portion base-facing surface 20, faces the base 14 and extends between the rib first end 31 and the rib second end 32. The height of the free-edge 38 is a distance between the free edge 38 and the end portion base-facing surface 20 in a direction normal to the base-facing surface 20 of the end portion 18. The free edge height varies between the rib first end 31 and the rib second end 32 such that the free edge 38 defines a curvilinear path, and the rib 30 has a non-linear profile defined by the free edge 38 when the rib 30 is viewed in a direction that is transverse to the first sidewall portion 22 (FIG. 7).

In the illustrated embodiment, the free edge 38 includes a first convex portion 41 corresponding to the location of greatest free edge height, and this location is between, and spaced apart from, the rib first end 31 and the rib second end 32. The free edge 38 includes a second convex portion 43 at a location between the first convex portion 41 and the rib second end 32. The second convex portion 43 has a smaller radius of curvature than the first convex portion, and is spaced apart from the rib second end 32. The free edge 38 includes a first ramp portion 40 that extends between the rib first end 31 and the first convex portion 41, and a second ramp portion 42 that extends between the first convex portion 41 and the second convex portion 43. In addition, the free edge 38 includes a flat portion that extends between the second convex portion 43 and the rib second end 32. The flat portion 44 is parallel to the end portion inner surface 20, while the free edge 38 increases in height along the first ramp portion 40 from the first end 31 to the first convex portion 41 and the free edge 38 decreases in height along the second ramp portion 42 from the first convex portion 41 to the second convex portion 43. In addition, the first ramp portion 40 has a shorter length than the second ramp portion 42 whereby the first convex portion 41, or rib maximum height, is closer to the rib first end 31 than the rib second end 32.

The rib 30 defines a second plane P2 that passes through the rib first end 31, the rib second end 32 and includes the free edge 38 (FIG. 4). The second plane P2 is perpendicular to both the third sidewall portion 24 and the end portion base-facing surface 20. The rib 30 has a triangular gusset 35 disposed on each of the side faces 33, 34 of the rib 30. Each gusset 35 extends between a side face (for example, side face 33) of the rib 30 and the end portion base-facing surface 20. The gussets 35 are disposed at a location between the rib first and second ends 31, 32 corresponding to the location of greatest free edge height.

The cover 16 includes a rail 51 that protrudes inward toward the base 14 from the end portion base-facing surface 20. The rail 51 extends in parallel to the third side portion 24 and intersects the second end 32 of each of the ribs 30, 50.

In addition, a side surface 53 of the rail 51 faces the third side portion 24 and provides a surface of the gap 52. Specifically, the gap 52 is bounded by the rail side surface 53, the cover base-facing surface 20 and the third side portion 24. The gap 52 is shaped and dimensioned to receive the flange first edge portion 91 when the PCB 80 is assembled within the housing 12 and the shroud portion 96 of the header 87 protrudes through the opening 28.

In use, the rail 51 serves as a stop that supports the flange 89 against insertion forces generated when a connector is inserted into the shroud portion 96 of the header 96. To this end, the rail 51 has a length sufficient to compensate for such insertion forces, and thus depends on the connector size. In the illustrated embodiment, the rail 51 is centered relative to the opening 28 and has a length that is about half the length of the opening 28. The second end 32 of the first rib 30 is connected to the rail 51 at a midpoint of the rail 51, and the second end 32 of the second rib 50 is connected to the rail 51 at a first end 54 of the rail 51. In addition, the opposed, second end 55 of the rail 51 is free standing.

Referring to FIG. 9, a method of assembling the PCB 80 within the housing 12 will now be described.

In an initial step (step 200) the PCB 80 is oriented relative to the housing 12 such that the PCB cover-facing surface 81 faces toward the cover 14 and such that the PCB first end 84 (e.g., the end of the PCB 80 that supports the header 87) serves as a leading edge. In addition, the PCB 80 is spaced apart from the cover open end 26, the PCB first end 84 generally overlies the first sidewall portion 22, and the PCB second end 85 does not overlie the cover 16.

Following orientation of the PCB 80 relative to the cover 16, the PCB 80 is inserted into the cover open end 26 (step 202) leading edge first such that the flange first edge portion 91 abuts the free edge 38 of the ribs 30, 50 at a location closer to the first sidewall portion 22 than the third sidewall portion 24, for example at a location generally corresponding to the first convex portion 41.

The PCB 80 is then moved toward the opening 28 by sliding the flange first edge portion 91 along the rib free edge 38 in a direction toward rib second end 32 and the third sidewall portion 24 (step 204). During the sliding motion, the flange first edge portion 91 follows the angular orientation of the curvilinear rib free edge 38 at each location of the rib free edge 38.

Since the PCB cover-facing surface 81 is parallel to the flange first edge portion 91, the rib free edge 38 changes the angular orientation of the PCB 80 relative to housing 12 as the flange first edge portion 91 slides along the rib free edge 38. Thus, for a given position x along the rib free edge 38, an angle $\theta$ of the PCB 80 relative to the base-facing surface 20 of the end portion 18 corresponds to the angle $\alpha$ of the rib free edge 38 relative to the base-facing surface 20 of the end portion 18. Moreover, the shape of the rib free edge 38 has been designed to control orientation of the PCB 80 in such a way that interference of the PCB 80, including the header 87 and/or electronic components 86 mounted on the PCB 80, with the housing 12 is avoided. That is, the rib free edge 38 is configured to orient the PCB 80 relative to the cover 16 in such a way that the electrical components 86 remain spaced apart from the cover first sidewall portion 22 during the sliding step 204.

The PCB 80 is slid along the rib free edge 38 toward the rib second end 32 until the flange first edge portion 91 passes beyond the rib second end 32 and the flange 89 enters the gap 52 between the rail 51 and the third sidewall portion 24. When the flange 89 is disposed in the gap 52, an outward facing surface 93 of the flange 89 abuts the third sidewall portion 24, and the shroud portion 96 protrudes through the opening 28. In addition, the PCB cover-facing surface 81 rests on the screw bosses 57, and the angle $\theta$ of the PCB 80 relative to the end portion base-facing surface 20 is zero such that the end portion 18 and PCB 80 are parallel.

Once the PCB 80 is disposed within the housing 12 in the above described position and orientation, the base 14 is placed within the open end 26 of the cover 16, and secured to the cover 16 using the fasteners 58 that engage with internal threads of the screw bosses 57.

The cover 16 is configured so that the header 87 of the PCB 80 is supported on the ribs 30, 50 during assembly of the PCB 80 with the housing 12. Upon completion of assembly, the PCB 80 is supported on the bosses 57 and/or other features provided on the inner surfaces of the sidewall portions 22, 23, 24, 25, whereby the PCB 80, including the header 87, is spaced apart from the ribs 30, 50.

FIGS. 10-16 show the position and orientation of the PCB 80 relative to the housing for selected locations of flange first edge portion 91 along the rib free edge 38.

Figure 10:
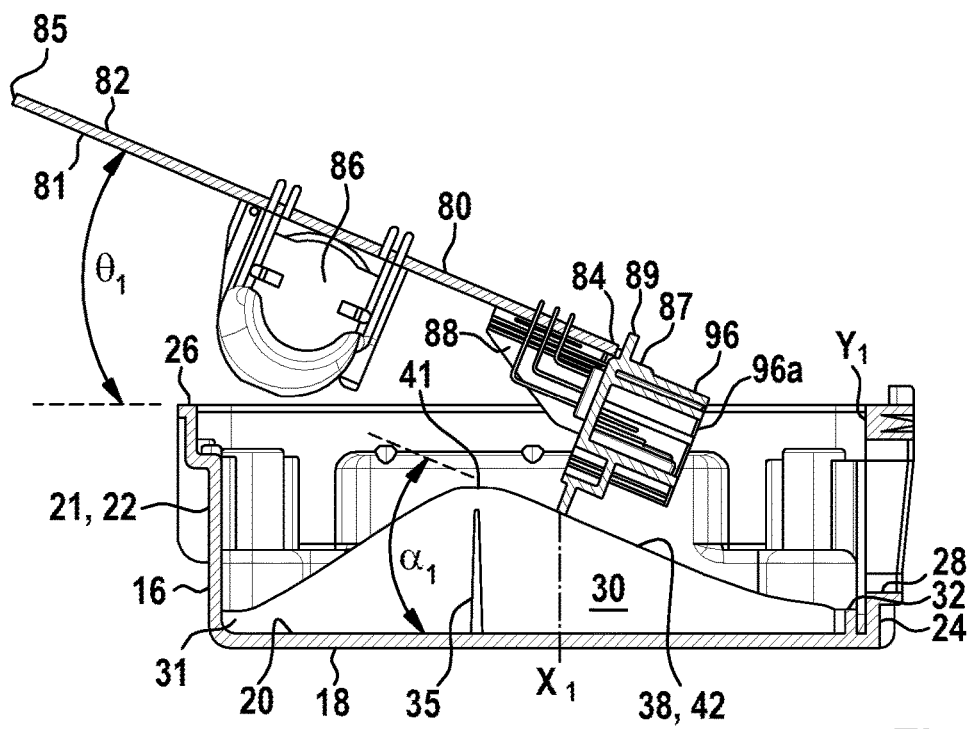
FIG. 10 is a cross sectional view of the housing cover and PCB illustrating the PCB at a first location X1 relative to the housing cover as seen along line 10-10 of FIG. 4.
Figure 11:
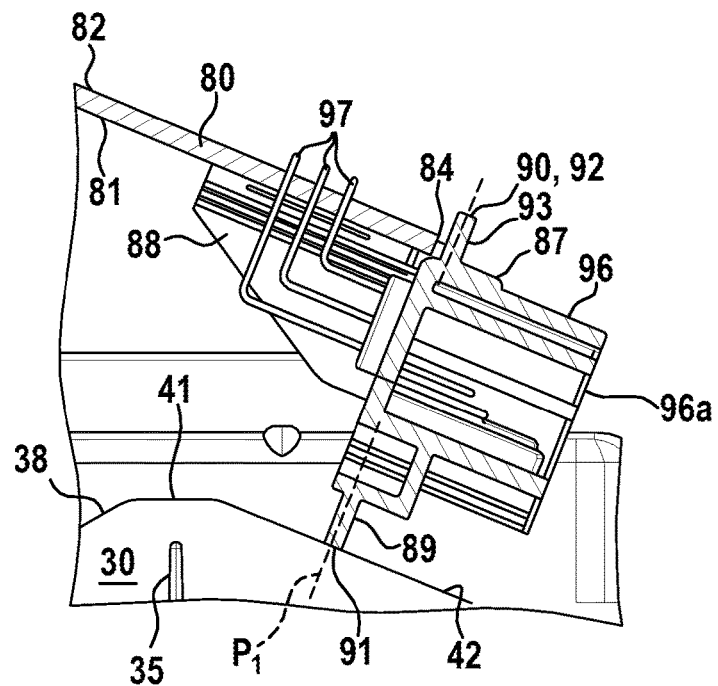
FIG. 11 is an enlarged view of a portion of FIG. 10.

Referring to FIGS. 10 and 11, the flange first edge portion 91 is shown in contact with the rib free edge 38 at a location X1 that is disposed along the second ramp portion 42 generally mid way between the rib first end 31 and the rib second end 32. At the location X1, the angle $\alpha 1$, corresponding to the angle $\alpha$ of the rib free edge 38 relative to the end portion base-facing surface 20 at location X1, is about 22 degrees. In addition, the angle $\theta 1$ of the PCB 80 relative to the end portion base-facing surface 20 at location X1 is also about 22 degrees. The angle $\theta 1$ is sufficient to allow the electronic components 86 disposed on the PCB cover-facing surface 81 to avoid interference with the first sidewall portion 22. The angle $\theta 1$ also ensures that as the leading edge 96a of the shroud portion 96 approaches the third sidewall portion 24, the shroud portion 96 is angled so as to avoid interference with the third sidewall portion 24 at a location Y1 between the opening 28 and the cover open end 26.

Figure 12:
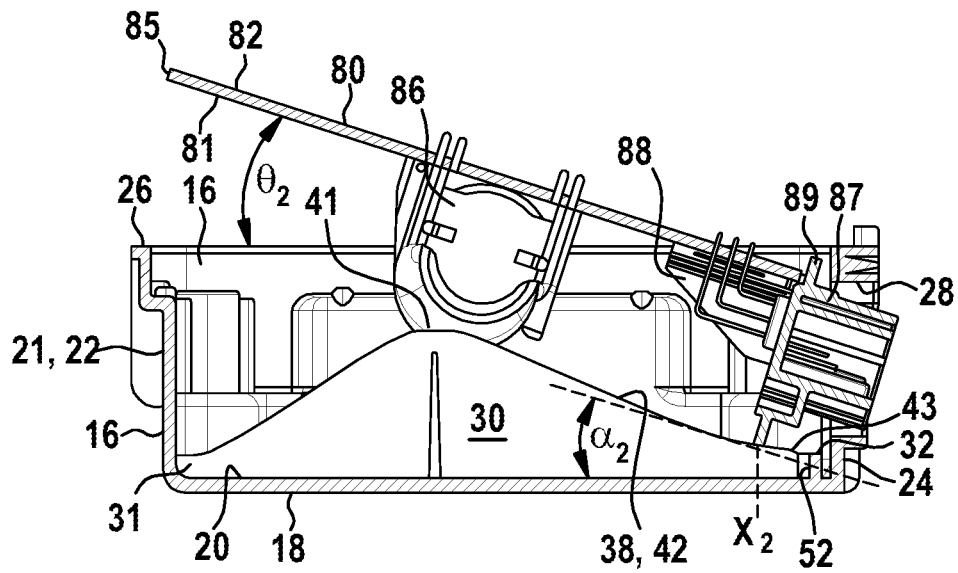
FIG. 12 is a cross sectional view of the housing cover and PCB illustrating the PCB at a second location X2 relative to the housing cover as seen along line 10-10 of FIG. 4.
Figure 13:
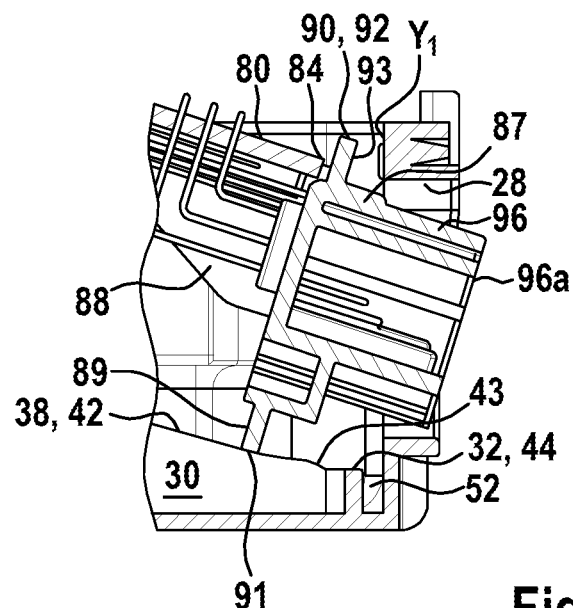
FIG. 13 is an enlarged view of a portion of FIG. 12.

Referring to FIGS. 12 and 13, the flange first edge portion 91 is shown in contact with the rib free edge 38 at a location X2 that is disposed along the second ramp portion 42 adjacent the second convex portion 43. At the location X2, the angle $\alpha 2$, corresponding to the angle $\alpha$ of the rib free edge 38 relative to the end portion base-facing surface 20 at location X2, and the angle $\theta 2$ of the PCB 80 relative to the end portion base-facing surface 20 at location X2, are about 17 degrees, and thus are less than the corresponding angles of location X1. When the flange first edge portion 91 is at position X2, the electronic components 86 have cleared the first sidewall portion 22 and are allowed to begin to drop into the space between the first rib 30 and the fourth wall portion 25. In addition, the shroud leading edge resides within the opening 28. The angle $\theta 2$ ensures that as the leading edge of the shroud portion 96 passes through the opening 28, the shroud portion 96 is angled so as to avoid interference with the third sidewall portion 24.

Figure 14:
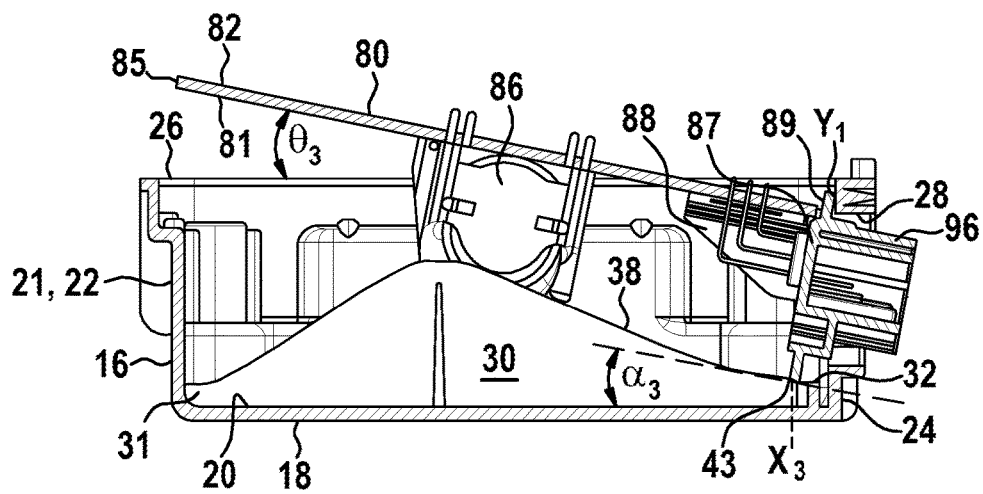
FIG. 14 is a cross sectional view of the housing cover and PCB illustrating the PCB at a third location X3 relative to the housing cover as seen along line 10-10 of FIG. 4.
Figure 15:
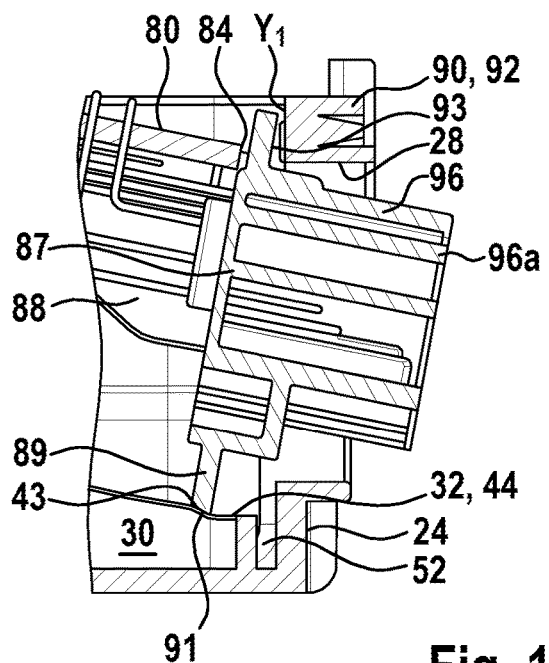
FIG. 15 is an enlarged view of a portion of FIG. 14.

Referring to FIGS. 14 and 15, the flange first edge portion 91 is shown in contact with the rib free edge 38 at a location X3 that is disposed along the second convex portion 43. At the location X3, the angle $\alpha 3$, corresponding to the angle $\alpha$ of the rib free edge 38 relative to the end portion base-facing surface 20 at location X3, and the angle $\theta 3$ of the PCB 80 relative to the end portion base-facing surface 20 at location X3, are about 11 degrees, and thus are less than the corresponding angles of location X2. When the flange first edge portion 91 is at position X3, the electronic components 86 are disposed within the space between the first rib 30 and the fourth sidewall portion 25. In addition, the flange outward-facing surface 93 abuts the third sidewall portion 24 at the location Y1 between the opening 28 and the cover open end 26, and the shroud leading edge resides outside the opening 28. The angle θ3 ensures that the shroud portion 96 is angled so as to avoid interference with the third sidewall portion 24.

Figure 16:
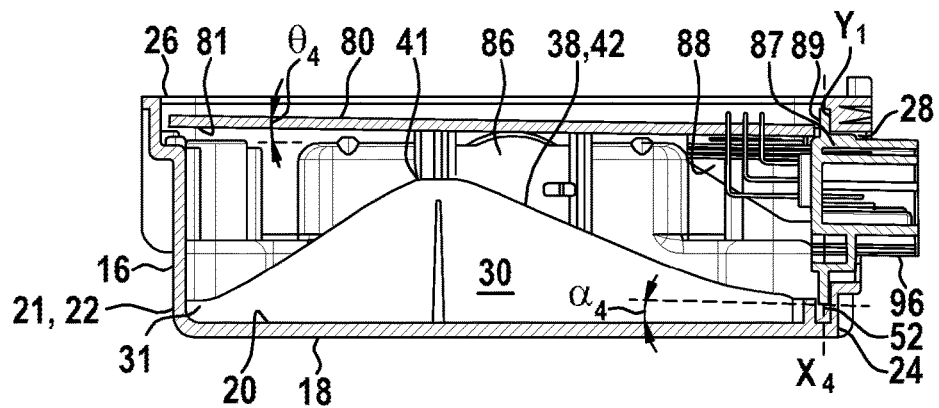
FIG. 16 is a cross sectional view of the housing cover and PCB illustrating the PCB at a fourth location X4 relative to the housing cover as seen along line 10-10 of FIG. 4.
Figure 17:
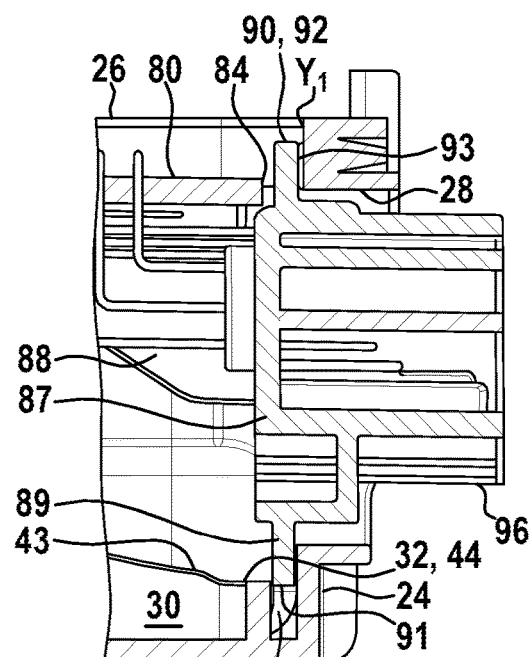
FIG. 17 is an enlarged view of a portion of FIG. 16.

Referring to FIGS. 16 and 17, the flange first edge portion 91 is shown in contact with the rib free edge 38 at a location X4 that is disposed along the flat portion 44 between the second convex portion 43 and the rib second end 32. At the location X4, the angle α4, corresponding to the angle α of the rib free edge 38 relative to the end portion base-facing surface 20 at location X4, and the angle θ4 of the PCB 80 relative to the end portion base-facing surface 20 at location X4, are about 2 degrees, and thus are less than the corresponding angles of location X3. When the flange first edge portion 91 is at position X4, the electronic components 86 are in-board relative to the first sidewall portion 22, and are in-board relative to the sidewall open end 26. In addition, the flange outward-facing surface 93 remains in contact with the third sidewall portion 24 at the location Y1 between the opening 28 and the cover open end 26. Still further, the flange first edge portion 92, although still in contact with the rib second end, has reached the terminal end of the flange free edge 38.

Figure 18:
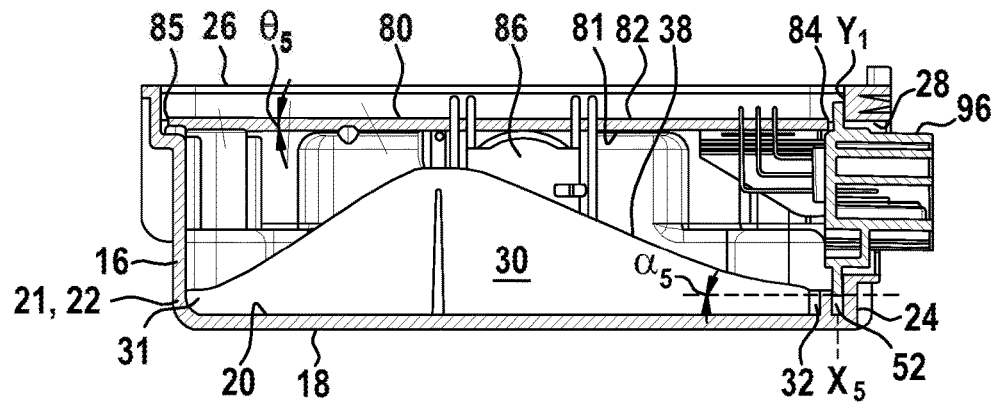
FIG. 18 is a cross sectional view of the housing cover and PCB illustrating the PCB at a fifth location X5 relative to the housing cover as seen along line 10-10 of FIG. 4.
Figure 19:
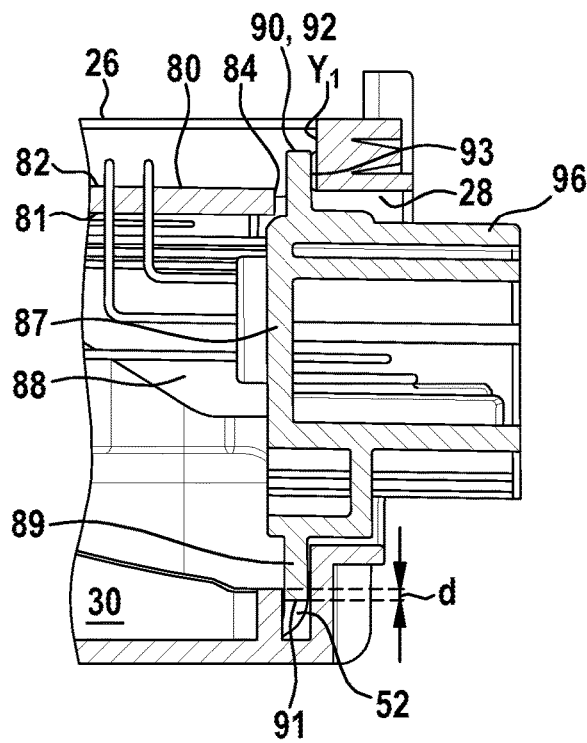
FIG. 19 is an enlarged view of a portion of FIG. 18.

Referring to FIGS. 18 and 19, the flange first edge portion 91 is shown spaced apart from the rib free edge 38 at a location X5 that corresponds to the gap 52. At the location X5, the angle α5, corresponding to the angle α of the rib free edge 38 relative to the end portion base-facing surface 20 at location X5, and the angle θ5 of the PCB 80 relative to the end portion base-facing surface 20 at location X5, are about 0 degrees. When the flange 89 is at position X5, the PCB 80 including the electronic components 86 are in-board relative to the sidewall 21, and the electronic components are disposed within the space between the first rib 30 and the fourth sidewall portion 25. In addition, the flange first edge portion 91 is disposed in the gap 52 at a location spaced apart from the end portion base-facing surface 20, and the shroud portion 96 is generally centered within the opening 28. As the flange first edge portion 91 slides off the rib second ends 32, it drops slightly, for example a distance d, as it enters the gap 52. By positioning the flange 89 within the gap 52 in the dropped position, overinsertion of the header 87 is prevented, which in turn prevents damage to the PCB 80 and/or electrical conductors (pins) 97 that can occur during overinsertion.

In this position, the PCB 80 is disposed within the housing 12 in the desired position (e.g., seated on the bosses 57) and orientation (e.g., parallel to the cover end portion 18). When the PCB 80 is in this position, a space exists between the PCB 80 and the ribs 30, 50 whereby the PCB is not supported on the ribs 30, 50. Instead, the PCB 80 is supported within the cover 16 on the screw bosses 57 disposed in each corner of the housing. In some embodiments, the sidewall portions 22, 23, 24, 25 may also include surface features that define elements that support the PCB 80 within the cover 16.

Because the PCB 80 slides along, and is guided by, the free edges 38 of the ribs 30, 50 during insertion, and because the ribs 30, 50 are configured so that the angular orientation of the PCB 80 relative to housing 12 changes as the PCB 80 is guided along the free edges 38 of the ribs 30, 50, the PCB 80, including the header 87 and/or electronic components 86 mounted on the PCB 80, avoids collision with the housing 12 during insertion of the PCB 80 into the housing 12.

Figure 20:
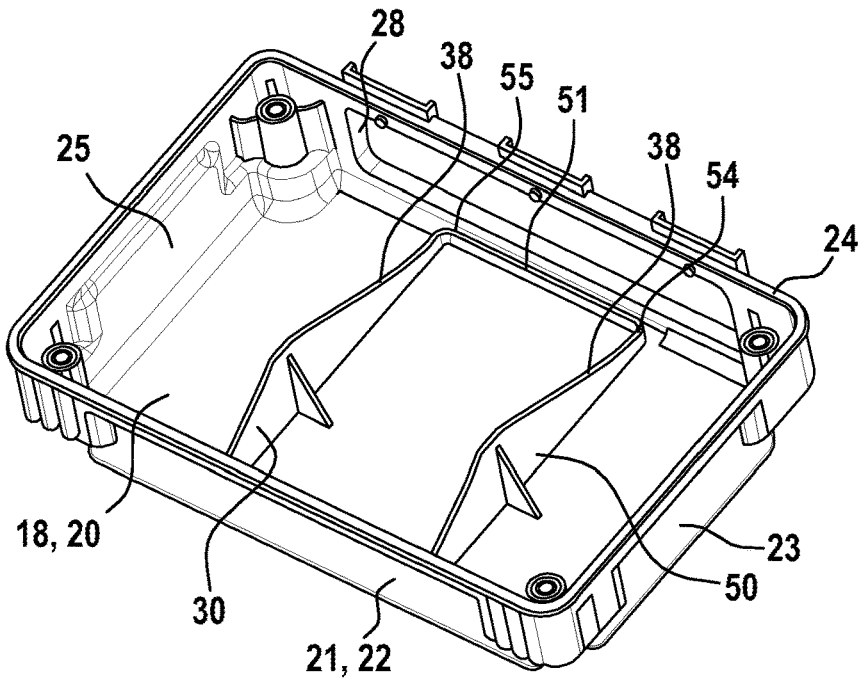
FIG. 20 is a bottom perspective view of an alternative embodiment housing cover.

In the embodiment illustrated in FIGS. 1-8, the ribs 30, 50 are offset to one end of the rail 51 to accommodate electronic components 86 disposed on the pcb cover-facing surface 81. It is understood, however, that the location of the ribs 30, 50 is not limited to the location shown in FIGS. 1-8. For example, in some embodiments where the electronic components 86 disposed on the pcb cover-facing surface 81 have a different arrangement, limitations on the placement of the ribs 30, 50 are removed. In this case, the first rib 30 may intersect the rail 51 at one end 55, and the second rib 50 may intersect the rail 51 at the other end 54 (FIG. 20).

Figure 21:
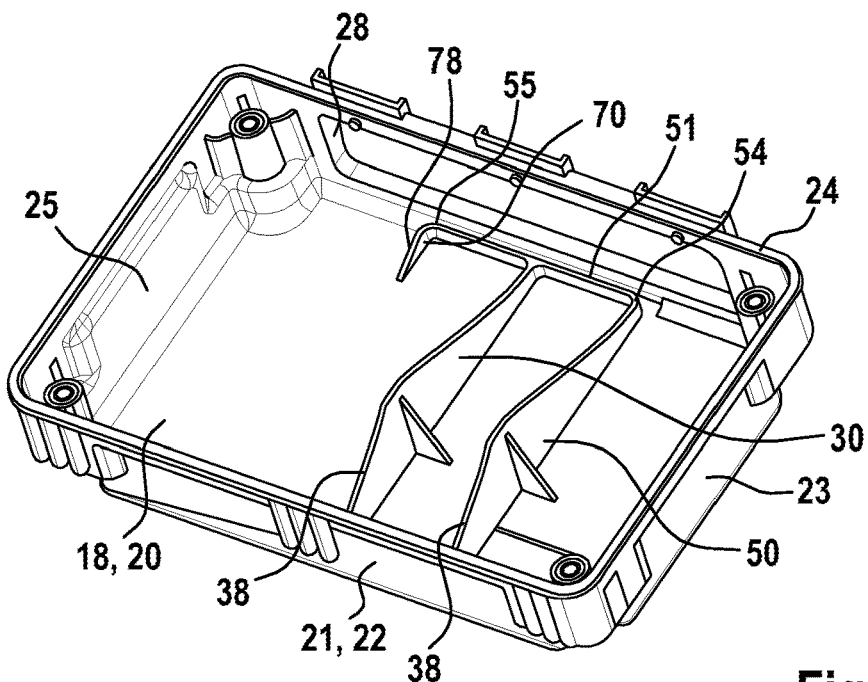
FIG. 21 is a bottom perspective view of another alternative embodiment housing cover.

In the embodiment illustrated in FIGS. 1-8, since the ribs 30, 50 are offset to one end of the rail 51, the second end 55 of the rail 51 is free standing. It is understood, however, that the second end 55 of the rail 51 is not limited to a free-standing configuration. Referring to FIG. 21, in some embodiments, a ramp 70 is provided at the rail second end 55. The ramp 70 is parallel to the first and second ribs 30, 50, and includes a free edge 78 that faces the base 14. The ramp free edge 78 provides a smooth transition between the end portion base-facing surface 20 and the rail 51, while providing additional structural reinforcement of the rail. As shown, the rail free edge 78 is formed as a linear incline, but is not limited to this configuration. In some applications, the ramp 70 may also serve to prevent the PCB 80 from catching the rail second end 55 during insertion of the PCB 80 into the housing 12.

In the illustrated embodiment, the housing 12 including the cover 16 is a low-profile rectangular prism. However, it is understood that the housing 12 and/or cover 16 are not limited to the shape or proportions illustrated, and the size, shape and proportions of the housing 16 and/or cover 16 are determined by the requirements of the specific application.

In the illustrated embodiment, the cover 16 includes two ribs 30, 50. Using two, spaced ribs has been shown to work well, since the flange 89 of the header 87 rests on both ribs during the sliding step of installation of the PCB 80 into the cover 16, providing a stable, two-point support for orienting the PCB 80 as desired. However, the cover 16 is not limited to having two ribs. In some embodiments, a single rib 30 may be provided, and in other embodiments, more than two ribs may be provided.

The ribs 30, 50 are illustrated herein as having a free edge 38 that has a particular shape. It is understood that the ribs 30, 50 are not limited the illustrated shape, and that the shape of the free edge 38 will depend on the requirements of the specific application, taking into account at least the housing geometry, the PCB geometry, the size and location of the electronic components, and the size and location of the header.

The ribs 30, 50 are illustrated herein as having a particular arrangement relative to the sidewall portions 22, 23, 24, 25 and end portion 18. It is understood that the ribs 30, 50 are not limited the illustrated arrangement, and the arrangement will depend on the requirements of the specific application, taking into account at least the housing geometry, the PCB geometry, the size and location of the electronic components, and the size and location of the header.

Selective illustrative embodiments of the device and method are described above in some detail. It should be understood that only structures considered necessary for clarifying the device and method have been described herein. Other conventional structures, and those of ancillary and auxiliary components of the device and method, are assumed to be known and understood by those skilled in the art. Moreover, while a working example of the device and method have been described above, the device and method

What is claimed, is:

1. An electronic control unit, comprising
a housing including
a base, and
a cover that overlies the base, the cover including
a planar end portion,
sidewall portions that surround a periphery of the end portion, and
a rib that protrudes inward from a base-facing surface of the end portion, the rib having
a first end adjacent a first one of the sidewall portions,
a second end adjacent a third one of the sidewall portions, and
a free edge that is spaced apart from the base-facing surface of the end portion, the free edge extending between the rib first end and the rib second end; and
a printed circuit board disposed in the housing, the printed circuit board including
a cover-facing surface,
a base-facing surface, and
electrical components supported on at least one of the cover-facing surface and the base-facing surface,
wherein
a height of the free edge is a distance between the free edge and the base-facing surface of the end portion in a direction normal to the base-facing surface of the end portion, and
the height of the free edge varies between the rib first end and the rib second end such that the height of the free edge is greatest at a location between the rib first end and the rib second end.

2. The electronic control unit of claim 1, wherein the free edge defines a curvilinear path between the first end and the second end.

3. The electronic control unit of claim 1, wherein the rib defines a plane that passes through the rib first end, the rib second end and the free edge, and the plane is perpendicular to the third one of the sidewall portions.

4. The electronic control unit of claim 1, wherein the rib includes
a first convex portion corresponding to the location of greatest height,
a second convex portion at a location between the first convex portion and the rib second end,
a first ramp portion between the rib first end and the first convex portion,
a second ramp portion at a location between the first convex portion and the second convex portion, and
a flat portion that is parallel to the end portion inner surface, the flat portion disposed between the second convex portion and the rib second end.

5. The electronic control unit of claim 1, wherein a first end of the rib is integral with the first one of the sidewall portions, and a gap exists between the rib second end and the third one of the sidewall portions.

6. The electronic control unit of claim 1, wherein the cover is configured so that the printed circuit board is supported on the rib during assembly of the printed circuit board with the housing, and when the printed circuit board is fully assembled with the housing, a space exists between the rib and the printed circuit board.

7. A housing for an electronic control unit, the housing comprising
a base, and
a cover that overlies the base, the cover including
a planar end portion,
sidewall portions that surround a periphery of the end portion, and
a rib that protrudes inward from a base-facing surface of the end portion, the rib having
a first end adjacent a first one of the sidewall portions,
a second end adjacent a third one of the sidewall portions, and
a free edge that is spaced apart from the base-facing surface of the end portion, the free edge extending between the rib first end and the rib second end;
wherein
a height of the free-edge is a distance between the free edge and the base-facing surface of the end portion in a direction normal to the base-facing surface of the end portion, and
the free edge height varies between the rib first end and the rib second end such that the free edge height is greatest at a location between the rib first end and the rib second end.

8. The electronic control unit of claim 7, wherein the free edge defines a curvilinear path between the first end and the second end.

9. The housing of claim 7, wherein the rib defines a plane that passes through the rib first end, the rib second end and the free edge, and the plane is perpendicular to the third one of the sidewall portions.

10. The housing of claim 7, wherein the rib includes
a first convex portion corresponding to the location of greatest height,
a second convex portion at a location between the first convex portion and the rib second end,
a first ramp portion between the rib first end and the first convex portion,
a second ramp portion at a location between the first convex portion and the second convex portion, and
a flat portion that is parallel to the end portion inner surface, the flat portion disposed between the second convex portion and the rib second end.

11. The housing of claim 7, wherein a first end of the rib is integral with the first one of the sidewall portions, and a gap exists between the rib second end and the third one of the sidewall portions.

12. The housing of claim 7, wherein the cover is configured so that the printed circuit board is supported on the rib during assembly of the printed circuit board with the housing, and when the printed circuit board is fully assembled with the housing, a space exists between the rib and the printed circuit board.

13. A method of assembling a printed circuit board within a housing, the housing including a base and a cover that overlies and can be secured to the base, the method comprising
providing the housing cover, the cover including
a planar end portion,
a first sidewall portion, a second sidewall portion, a third sidewall portion and a fourth sidewall portion, the first, second, third and fourth sidewall portions surrounding a periphery of the end portion and protruding in a direction normal to a base-facing surface of the end portion, the third sidewall portion having an opening, the third sidewall portion being opposed to the first sidewall portion, free ends of the first, second, third and fourth sidewall portion defining a cover open end, and a rib that protrudes inward from the base-facing surface of the end portion;
providing the printed circuit board, the printed circuit board including
a cover-facing surface,
a base-facing surface, and
electrical components supported on at least the printed circuit board cover-facing surface, and
a header supported on the printed circuit board cover-facing surface, the header disposed at a first end of the printed circuit board so as to protrude outward from the printed circuit board first end in a direction parallel to the printed circuit board cover-facing surface, the header including a flange, the flange residing in a plane that is transverse to the printed circuit board cover facing surface, the flange including a first edge parallel to and facing away from the printed circuit board cover-facing surface;
orienting the printed circuit board such that the printed circuit board cover-facing surface faces toward the cover and the header serves as a leading edge;
inserting the printed circuit board into the cover open end such that the flange first edge abuts a free edge of the rib; and
sliding the flange first edge along the rib free edge in a direction toward the third sidewall portion, the rib free edge configured to change the angular orientation of the printed circuit board relative to housing as the flange first edge slides along the rib free edge.

14. The method of claim 13, wherein, for a given position of the flange first edge along the rib free edge, an angle of the printed circuit board relative to the base-facing surface of the end portion corresponds to the angle of the rib free edge relative to the base-facing surface of the end portion.

15. The method of claim 13, wherein the rib free edge is configured so that the angular orientation of the printed circuit board relative to housing changes as the printed circuit board slides along the free edge.

16. The method of claim 13, wherein during the step of sliding, the printed circuit board is supported on the rib, and subsequent to the step of sliding and when the printed circuit board is assembled within the housing, a space exists between the rib and the printed circuit board.

17. The method of claim 13, wherein the header includes
a mount portion disposed on one side of the flange, the mount portion overlying the printed circuit board first end, and
a shroud portion disposed on another side of the flange, the shroud portion protruding outward from the printed circuit board first end in a direction parallel to the printed circuit board cover-facing surface;
and wherein the third one of the sidewall portions has an opening, and
the step of sliding the flange first edge along the rib free edge in a direction toward the third sidewall portion includes passing the shroud portion through the opening.

18. The method of claim 17, wherein the rib free edge is configured so that the angular orientation of the printed circuit board relative to housing changes as the printed circuit board slides along the free edge of the rib.

19. The method of claim 13, wherein the rib free edge is configured to orient the printed circuit board relative to the cover in such a way that the electrical components remain spaced apart from the cover first sidewall portion during sliding.

20. The method of claim 13, wherein a gap exists between the rib second end and the third sidewall portion, and following the step of sliding the flange first edge along the rib free edge, the flange first edge moves into the gap, and the shroud portion protrudes through the opening.

* * * * *